(12) United States Patent
Yang et al.

(10) Patent No.: US 7,474,580 B2
(45) Date of Patent: Jan. 6, 2009

(54) APPARATUS AND METHOD FOR CONTROLLING REFRESH OPERATION OF SEMICONDUCTOR INTEGRATED CIRCUIT

(75) Inventors: Jong-Yeol Yang, Gyeonggi-do (KR); Tae-Woo Kwon, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 39 days.

(21) Appl. No.: 11/647,468

(22) Filed: Dec. 29, 2006

(65) Prior Publication Data

US 2007/0291568 A1  Dec. 20, 2007

(30) Foreign Application Priority Data

Jun. 12, 2006  (KR) .................. 10-2006-0052394

(51) Int. Cl.
*G11C 7/00* (2006.01)
(52) U.S. Cl. .................. 365/222; 365/191; 365/233.1; 365/211
(58) Field of Classification Search .............. 365/222, 365/191, 233.1, 211
See application file for complete search history.

(56) References Cited

U.S. PATENT DOCUMENTS

| 5,532,968 | A | 7/1996 | Lee |
| 5,862,093 | A | 1/1999 | Sakakibara |
| 6,667,925 | B2 | 12/2003 | Kobayashi et al. |
| 6,898,140 | B2 | 5/2005 | Leung et al. |
| 2004/0076054 | A1* | 4/2004 | Takahashi .................. 365/200 |
| 2005/0146968 | A1* | 7/2005 | Shinozaki et al. .......... 365/222 |
| 2006/0244490 | A1 | 11/2006 | Ha et al. |
| 2007/0253269 | A1* | 11/2007 | Pyeon ....................... 365/222 |

FOREIGN PATENT DOCUMENTS

| JP | 4141885 | 5/1992 |
| JP | 5054648 | 3/1993 |
| JP | 11-066845 | 3/1999 |
| JP | 10-1995-0034258 | 12/2005 |
| JP | 2006-031860 | 2/2006 |
| KR | 100172234 | 10/1998 |
| KR | 1020020002659 | 1/2002 |
| KR | 1020050100261 | 10/2005 |

\* cited by examiner

*Primary Examiner*—Thong Q Le
(74) *Attorney, Agent, or Firm*—Venable LLP; Jeffri A. Kaminski

(57) ABSTRACT

A semiconductor memory integrated circuit for controlling a refresh operation includes: a first period generating unit that generates a first periodic signal having an uniformed period; a second period generating unit that generates a second periodic signal according to a first control signal; a period generation control unit that generates a timing signal for every predetermined period; a frequency dividing unit that divides the frequency of the first periodic signal into at least one frequency-divided periodic signals; and a period selection control unit that controls the operation of the second period generating unit according to the at least one frequency-divided periodic signals and the second periodic signal, determines temperature, and outputs one of the frequency-divided periodic signals corresponding to the determined temperature as a refresh signal.

32 Claims, 6 Drawing Sheets

APPARATUS AND METHOD FOR CONTROLLING REFRESH OPERATION OF SEMICONDUCTOR INTEGRATED CIRCUIT

BACKGROUND

1. Technical Field

The present invention relates to a semiconductor memory, and more particularly, to an apparatus and method for controlling a refresh operation of a semiconductor integrated circuit.

2. Related Art

In a semiconductor memory integrated circuit, particularly, a semiconductor memory integrated circuit used for mobile devices, a reduction in power consumption is an important indicators of performance. Therefore, a method of generating a refresh signal for a refresh operation, which is a necessary operation of the semiconductor memory integrated circuit, such that the period of the refresh signal is two to twenty times larger at a low temperature than that at a high temperature, is used.

Two types of period generating circuits are used to realize the above-mentioned method. One period generating circuit (first period generating circuit) generates a pulse having an uniform (that is, fixed) period without being affected by temperature. The other period generating circuit (second period generating circuit) generates a pulse whose period varies according to a variation in temperature.

The pulse generated by the second period generating circuit is used as a refresh signal at a temperature equal to or higher than room temperature, and the pulse generated by the first period generating circuit is used as the refresh signal at a temperature lower than room temperature.

However, even when only the pulse generated by one of the two period generating circuits is used as the refresh signal, the other period generating circuit is continuously operated, which causes unnecessary current consumption. In particular, when the second period generating circuit generates a high-frequency pulse (a pulse having a small period) under a high temperature condition, current consumption increases.

SUMMARY

An embodiment of the present invention provides an apparatus for controlling a refresh operation of an integrated circuit, capable of reducing current consumption.

Another embodiment of the present invention provides a method of controlling a refresh operation of a semiconductor memory integrated circuit capable of reducing current consumption.

According to an embodiment of the present invention, an apparatus for controlling a refresh operation of a semiconductor memory integrated circuit includes: a first period generating unit that generates a first periodic signal having an uniform period; a second period generating unit that generates a second periodic signal on the basis of a first control signal; a period generation control unit that generates a timing signal for every predetermined period; a frequency dividing unit that divides the frequency of the first periodic signal into at least one frequency-divided periodic signals; and a period selection control unit that controls the operation of the second period generating unit on the basis of the one or more frequency-divided periodic signals and the second periodic signal, determines temperature, and outputs one of the frequency-divided periodic signals corresponding to the determined temperature as a refresh signal.

According to another embodiment of the present invention, there is provided a method of controlling a refresh operation of a semiconductor memory integrated circuit including a first period generating unit that generates a first periodic signal having an uniform period, a frequency dividing unit that divides the frequency of the first periodic signal into at least one frequency-divided periodic signal and outputs the frequency-divided periodic signal, and a second period generating unit that generates a second periodic signal whose period varies according to temperature. The method includes: operating the second period generating unit; comparing a time when the second period generating unit generates the second periodic signal, the first periodic signal, and the at least one frequency-divided periodic signal to determine the temperature; stopping to operate the second period generating unit according to the timing of the determination of the temperature; and selecting one of the frequency-divided periodic signals and the first periodic signal corresponding to the determined temperature to output the selected signal as a refresh signal.

DESCRIPTION OF EXEMPLARY EMBODIMENT

An apparatus and method for controlling a refresh operation of a semiconductor memory according to exemplary embodiments of the present invention will now be described in detail with reference to the accompanying drawings.

Figure 1:
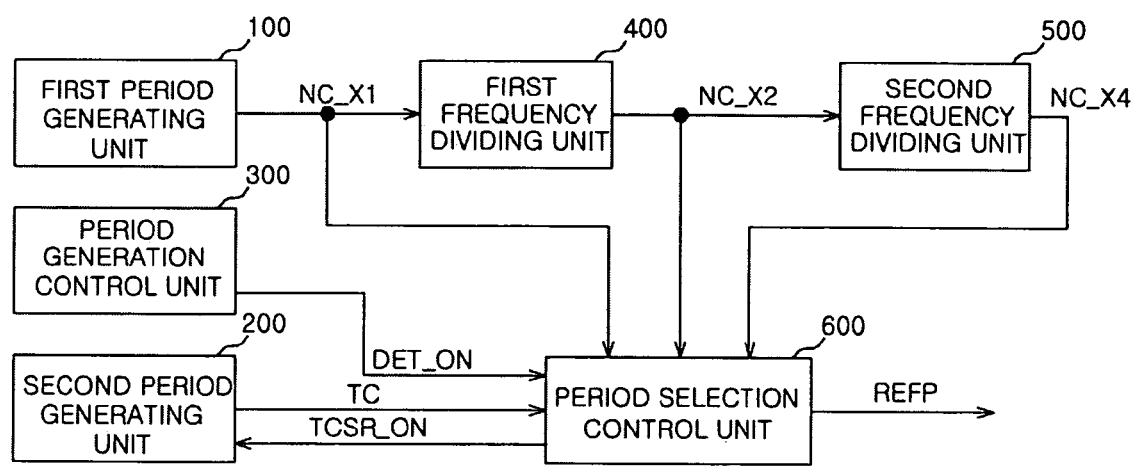
FIG. 1 is a block diagram illustrating an apparatus for controlling a refresh operation of a semiconductor memory integrated circuit according to an embodiment of the present invention.

As shown in FIG. 1, an apparatus for controlling a refresh operation of a semiconductor memory integrated circuit according to an embodiment of the present invention includes a first period generating unit 100, a second period generating unit 200, a period generation control unit 300, a first frequency dividing unit 400, a second frequency dividing unit 500, and a period selection control unit 600.

The first period generating unit 100 generates a first periodic signal NC_X1 having an uniform (fixed) period. The second period generating unit 200 generates a second periodic signal TC having a period that varies according temperature in response to a first control signal TCSR_ON. The period generation control unit 300 generates a timing signal DET_ON for informing a temperature determining period in a predetermined cycle. The first frequency dividing unit 400 divides the frequency of the first periodic signal NC_X1 output from the first period generating unit 100 by two to generate a periodic signal NC_X2. The second frequency dividing unit 500 divides the frequency of the periodic signal NC_X2 output from the first frequency dividing unit 400 by two to generate a periodic signal NC_X4. The period selection control unit 600 generates the first control signal TCSR_ON and determines temperature on the basis of the periodic signals NC_X1, NC_X2, NC_X4, DET_ON, and TC and outputs one of the periodic signals NC_X1, NC_X2, and NC_X4 corresponding to the determined temperature as a refresh signal REFP.

Figure 2:
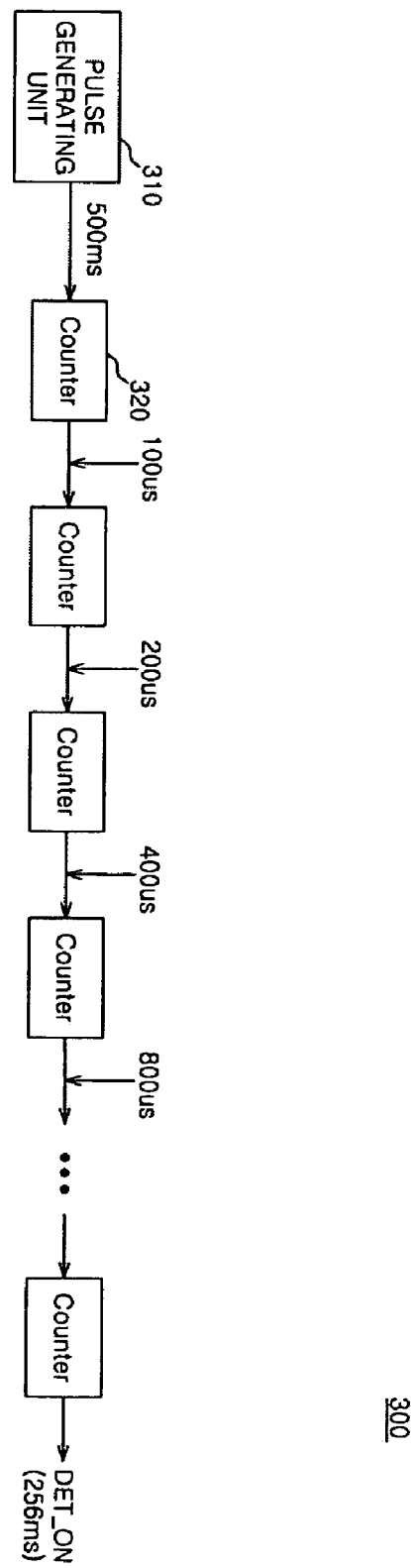
FIG. 2 is a block diagram illustrating a period generation control unit shown in FIG. 1.

Referring to FIG. 2, the period generation control unit 300 includes a pulse generating unit 310 that generates a basic pulse and a plurality of counters 320 that sequentially count the basic pulse generated by the pulse generating unit 310, to generate the timing signal DET_ON. The period generation control unit 300 generates the timing signal DET_ON for every predetermined period (for example, 256 ms).

Figure 3:
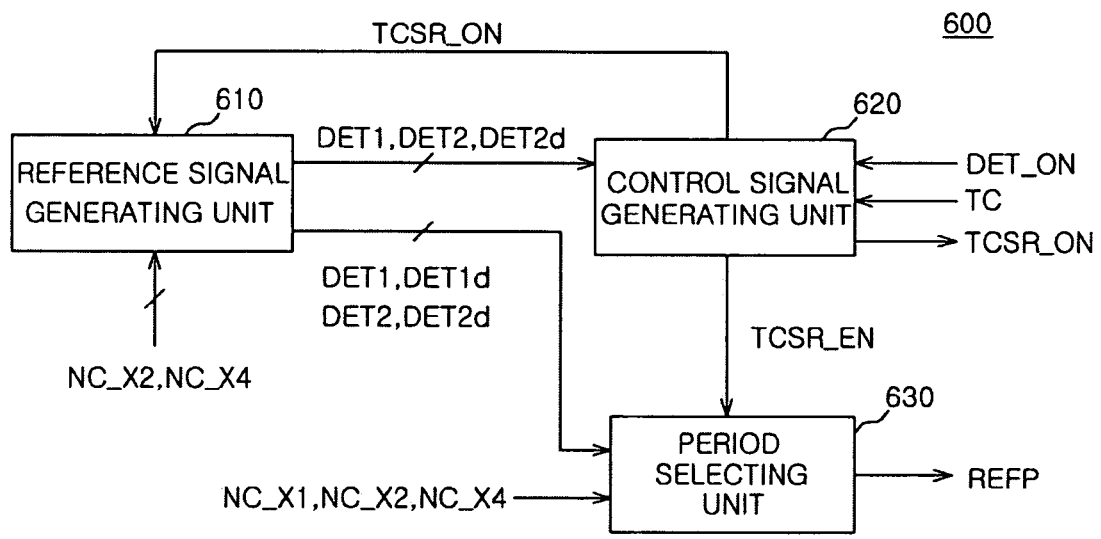
FIG. 3 is a block diagram illustrating the period generation control unit shown in FIG. 1.

Referring to FIG. 3, the period selection control unit 600 includes a reference signal generating unit 610, a control signal generating unit 620, and a period selecting unit 630.

The reference signal generating unit 610 generates a first reference signal DET1, a first delayed reference signal DET1d, a second reference signal DET2, and a second delayed reference signal DET2d by using the periodic signals NC_X2 and NC_X4 in response to the first control signal TCSR_ON. The control signal generating unit 620 generates the first control signal TCSR_ON and a second control signal TCSR_EN in response to the signals DET_ON, DET1, DET2, and DET2d. The period selecting unit 630 outputs one of the periodic signals NC_X1, NC_X2, and NC_X4 as the refresh signal REFP in response to the signals DET1, DET1d, DET2, DET2d, and TCSR_EN.

Figure 4:
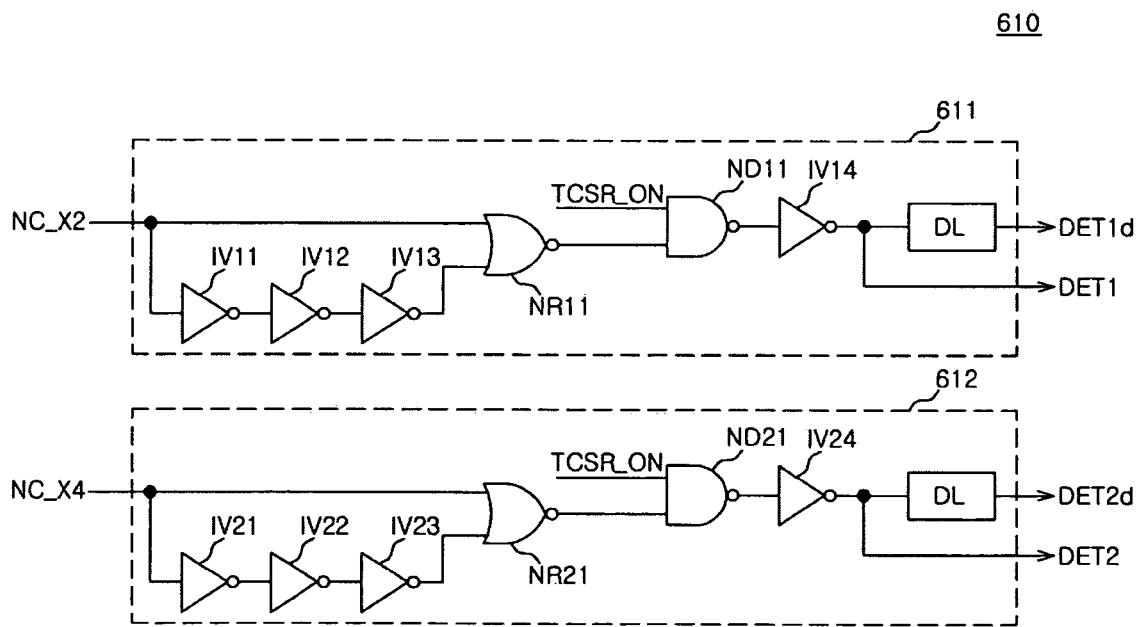
FIG. 4 is a circuit diagram illustrating a reference signal generating unit shown in FIG. 3.

Referring to FIG. 4, the reference signal generating unit 610 includes a first reference signal generating unit 611 and a second reference signal generating unit 612. The first reference signal generating unit 611 generates the signals DET1 and DET1d by using the periodic signal NC_X2 in response to the first control signal TCSR_ON. The second reference signal generating unit 612 generates the signals DET2 and DET2d by using the periodic signal NC_X4 in response to the first control signal TCSR_ON.

The first reference signal generating unit 611 includes: a series of inverters IV11 to IV13 to which the periodic signal NC_X2 is input; a NOR gate NR11 to which the output of the inverter IV13 and the periodic signal NC_X2 are input; a NAND gate ND11 to which the output of the NOR gate NR11 and the first control signal TCSR_ON are input; an inverter IV14 that receives the output of the NAND gate ND11 and outputs the first reference signal DET1; and a delay DL that delays the output of the inverter IV14 to output the first delayed reference signal DET1d. The first reference signal generating unit 611 generates the first reference signal DET1 at the timing when one period of the periodic signal NC_X2 elapses. That is, the NOR gate NR11 generates the first reference signal DET1 if the first control signal TCSR_ON is at a high level at the time when the periodic signal NC_X2 changes from a low level to the next low level via a high level (Low→High→Low), and the first reference signal DET1 is delayed by a predetermined amount of time, resulting in the first delayed reference signal DET1d.

The second reference signal generating unit 612 includes: a series of inverters IV21 to IV23 to which the periodic signal NC_X4 is input; a NOR gate NR21 to which the output of the inverter IV23 and the periodic signal NC_X4 are input; a NAND gate ND21 to which the output of the NOR gate NR21 and the first control signal TCSR_ON are input; an inverter IV24 that receives the output of the NAND gate ND21 and outputs the second reference signal DET2; and a delay DL that delays the output of the inverter IV24 to output the second delayed reference signal DET2d. The second reference signal generating unit 612 generates the second reference signal DET2 at the timing when one period of the periodic signal NC_X4 elapses. That is, the NOR gate NR21 generates the second reference signal DET2 if the first control signal TCSR_ON is at a high level at the time when the periodic signal NC_X4 changes from a low level to the next low level via a high level (Low→High→Low), and the second reference signal DET2 is delayed by a predetermined amount of time, resulting in the second delayed reference signal DET2d.

Figure 5:
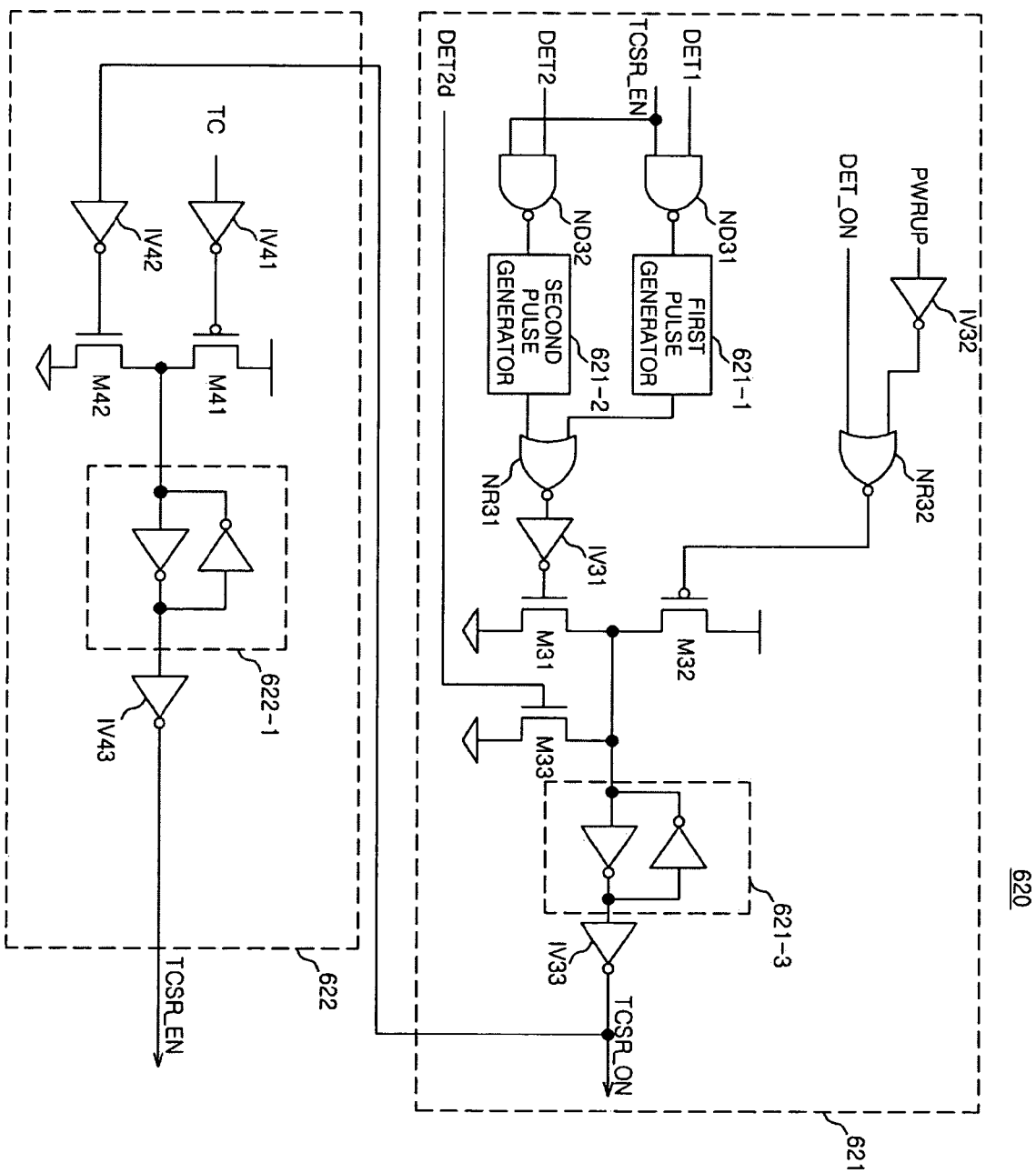
FIG. 5 is a circuit diagram illustrating a control signal generating unit shown in FIG. 3.

Referring to FIG. 5, the control signal generating unit 620 includes a first control signal generating unit 621 that outputs the first control signal TCSR_ON in response to a power-up signal PWRUP, the timing signal DET_ON, and the signals DET1, DET2 and DET2d; and a second control signal generating unit 622 that outputs the second control signal TCSR_EN in response to the first control signal TCSR_ON and a second periodic signal TC.

The first control signal generating unit 621 includes: a first NAND gate ND31 to which the signals DET1 and TCSR_EN are input; a second NAND gate ND32 to which the signals DET2 and TCSR_EN are input; a first pulse generator 621-1 to which the output of the first NAND gate ND31 is input; a second pulse generator 621-2 to which the output of the second NAND gate ND32 is input; a first NOR gate NR31 to which the outputs of the first and second pulse generators 621-1 and 621-2 are input; a first inverter IV31 to which the output of the first NOR gate NR31 is input; a first transistor M31 that has a gate to which the output of the first inverter IV31 is input and a source connected to the ground; a second inverter IV32 to which the power-up signal PWRUP is input; a second NOR gate NR32 to which the output of the second inverter IV32 and the timing signal DET_ON are input; a second transistor M32 that has a gate to which the output of the second NOR gate NR32 is input, a source connected to a power supply terminal, and a drain connected to a drain of the first transistor M31; a third transistor M33 that has a gate to which the second delayed reference signal DET2d is input, a source connected to the ground, and a drain connected to both the drain of the first transistor M31 and the drain of the second transistor M32; a latch 621-3 that has an input terminal connected to the drain of the third transistor M33; and a third inverter IV33 that receives the output of the latch 621-3 to output the first control signal TCSR_ON.

The first control signal generating unit 621 keeps the first control signal TCSR_ON at an enable level, that is, a high level such that the second period generating unit 200 is operated until the determination of temperature (i.e., whether the temperature is higher or lower than a critical temperature is completed. When the determination of temperature is completed, the first control signal generating unit 621 changes the first control signal TCSR_ON to a disable level, that is, a low level.

That is, since the second transistor M32 is turned on by the timing signal DET_ON having a high level, the first control signal TCSR_ON having a high level is output through the latch 621-3 and the third inverter IV33.

When both the signals TCSR_EN and DET1 change to a high level at the same time, the output of the first NAND gate ND31 turns from a high level to a low level, thus the first pulse generator 621-1 outputs a high-level pulse. As a result, the first transistor M31 is turned on, thus third inverter IV33 outputs the first control signal TCSR_ON having a low level through the latch 621-3.

When both the signals TCSR_EN and DET2 change to a high level at the same time, the output of the second NAND gate ND32 turns from a high level to a low level, thus the second pulse generator 621-2 outputs a high-level pulse. As a result, the first transistor M31 is turned on, thus the third inverter IV33 outputs the first control signal TCSR_ON having a low level through the latch 621-3.

Figure 7:
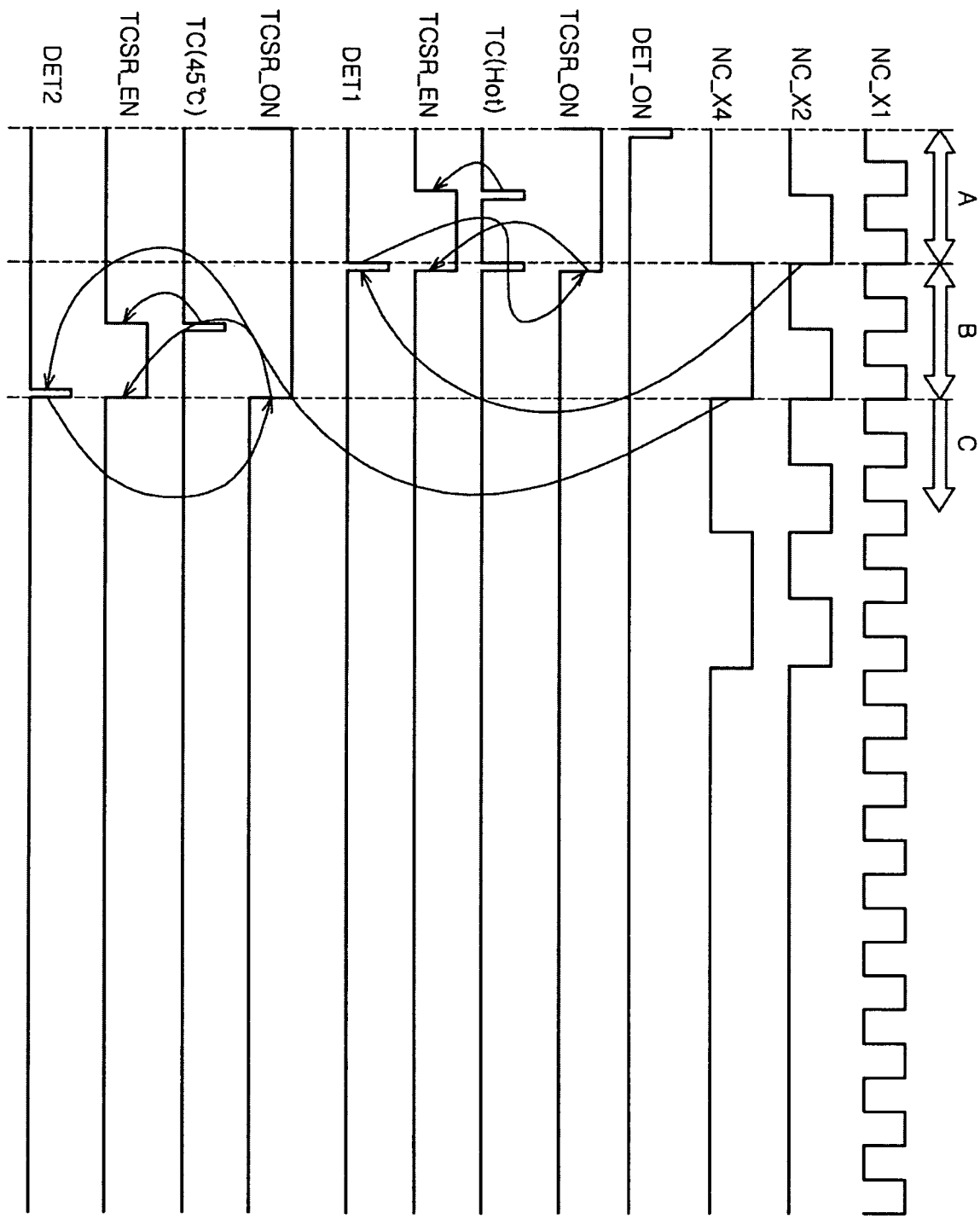
FIG. 7 is a timing chart illustrating the operation of the apparatus for controlling the refresh operation of the semiconductor memory integrated circuit according to an embodiment of the present invention.

Even if both the signal TCSR_EN and DET1 do not change to a high level at the same time, or both the signals TCSR_EN and DET2 do not change to a high level at the same time, the operation of the second period generating unit 200 should stop when a period B of FIG. 7 elapses. Therefore, when the high-level signal DET2d obtained by delaying the second reference signal DET2 by a predetermined amount of time is input to the third transistor M33, the third transistor M33 is turned on, thus the third inverter IV33 outputs the first control signal TCSR_ON having a low level through the latch 621-3.

The second control signal generating unit 622 includes a first inverter IV41 to which the second periodic signal TC is input; a first transistor M41 that has a source connected to the power supply terminal and a gate to which the output of the first inverter IV41 is input; a second inverter IV42 to which the first control signal TCSR_ON is input; a second transistor M42 that has a source connected to the ground, a gate to which the output of the second inverter IV42 is input, and a drain connected to a drain of the first transistor M41; a latch 622-1 that has an input terminal connected to a connection node between the first transistor M41 and the second transistor M42 (that is, the drains of the first and second transistors M41 and M42); and a third inverter IV43 that is connected to an output terminal of the latch 622-1 and outputs the second control signal TCSR_EN.

Figure 6:
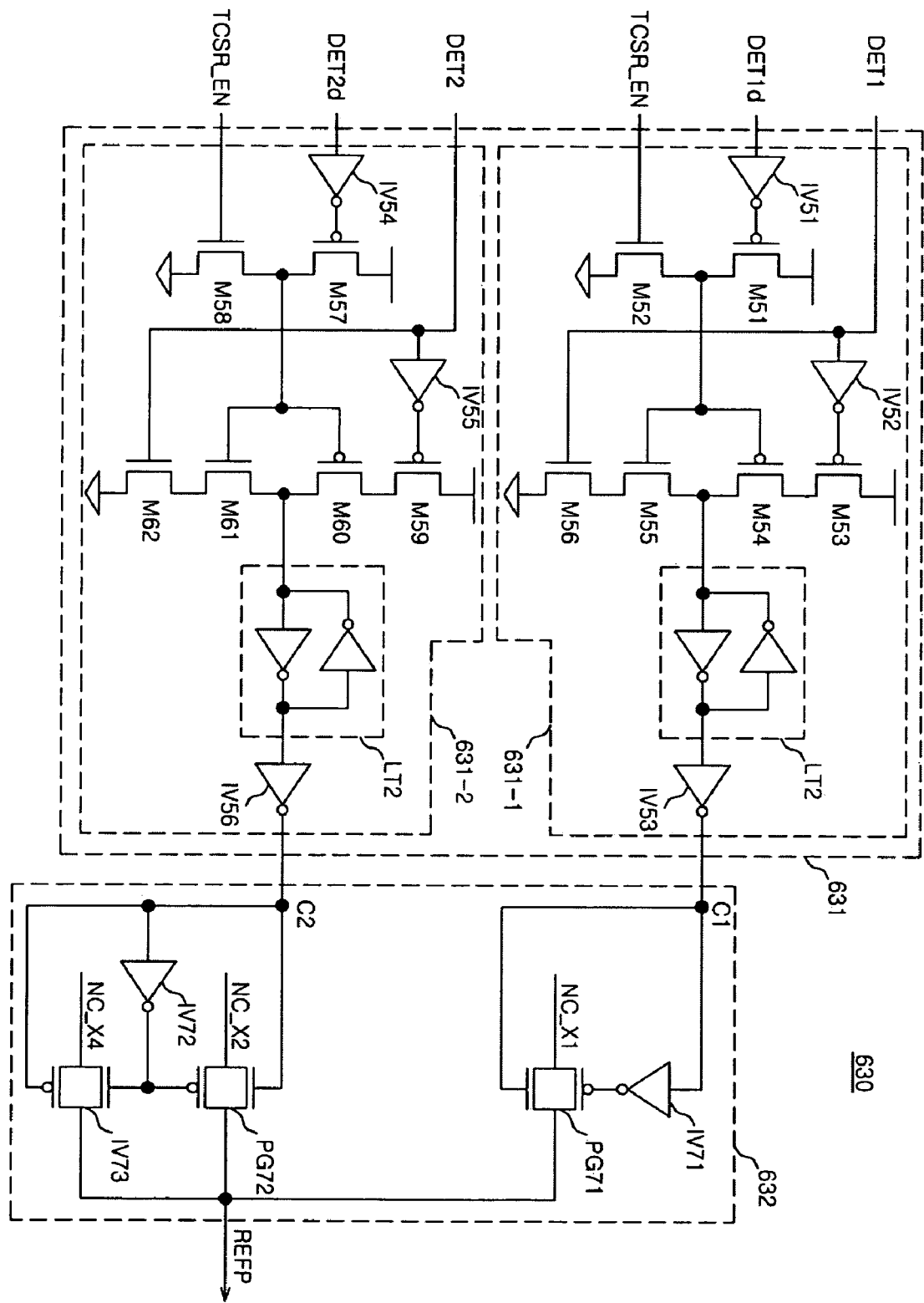
FIG. 6 is a circuit diagram illustrating a period selecting unit shown in FIG. 3.

The second control signal generating unit 622 keeps the second control signal TCSR_EN at a low level during a period for which the first control signal TCSR_ON is at a low level. Then, when the second periodic signal TC is generated after the first control signal TCSR_ON turns to a high level, the second control signal generating unit 622 changes the second control signal TCSR_EN to a high level and maintains the second control signal TCSR_EN at the high level until the first control signal TCSR_ON changes to a low level. The second control signal TCSR_EN is a signal used to monitor the generation of the second periodic signal TC and to maintain the monitored state until a period selecting operation of the period selecting unit 630 shown in FIG. 6 is completed. That is, the second transistor M42 is turned on during a period for which the first control signal TCSR_ON is at a low level, the third inverter IV43 outputs the second control signal TCSR_EN having a low level through the latch 622-1. When the second periodic signal TC turns to a high level after the first control signal TCSR_ON changes to a high level, the second control signal TCSR_EN having a high level is output through the latch 622-1 and the third inverter IV43, and the second control signal TCSR_EN is maintained at the high level until the first control signal TCSR_ON turns to a low level.

Referring to FIG. 6, the period selecting unit 630 includes a switching control unit 631 that outputs first and second switching signals C1 and C2 according to the signals DET1, DET1d, DET2, DET2d, and TCSR_EN and a switching unit 632 that passes one of the periodic signals NC_X1, NC_X2, and NC_X4 on the basis of the switching signals C1 and C2.

The switching control unit 631 includes a first switching control unit 631-1 that outputs the switching signal C1 according to the signals DET1, DET1d, and TCSR_EN and a second switching control unit 631-2 that outputs the second switching signal C2 according to the signals DET2, DET2d, and TCSR_EN.

The first switching control unit 631-1 includes: a first inverter IV51 to which the first delayed reference signal DET1d is input; a first transistor M51 that has a source connected to the power supply terminal and a gate to which the output of the first inverter IV51 is input; a second transistor M52 that has a source connected to the ground, a gate to which the second control signal TCSR_EN is input, and a drain connected to a drain of the first transistor M51; a second inverter IV52 to which the first reference signal DET1 is input; a third transistor M53 that has a source connected to the power supply terminal and a gate to which the output of the second inverter IV52 is input; a fourth transistor M54 that has a source connected to a drain of the third transistor M53 and a gate connected to a node between the first transistor M51 and the second transistor M52; a fifth transistor M55 that has a drain connected to a drain of the fourth transistor M54 and a gate connected to the node between the first transistor M51 and the second transistor M52; a sixth transistor M56 that has a drain connected to a source of the fifth transistor M55, a gate to which the signal DET1 is input, and a source connected to the ground; a first latch LT1 that has an input terminal connected to a node between the fourth transistor M54 and the fifth transistor M55; and a third inverter IV53 that receives the output of the first latch LT1 and outputs the switching signal C1.

The second switching control unit 631-2 includes a fourth inverter IV54 to which the second delayed reference signal DET2d is input; a seventh transistor M57 that has a source connected to the power supply terminal and a gate to which the output of the fourth inverter IV54 is input; an eighth transistor M58 that has a source connected to the ground, a gate to which the second control signal TCSR_EN is input, and a drain connected to a drain of the seventh transistor M57; a fifth inverter IV55 to which the second reference signal DET2 is input; a ninth transistor M59 that has a source connected to the power supply terminal and a gate to which the output of the fifth inverter IV55 is input; a tenth transistor M60 that has a source connected to a drain of the ninth transistor M59 and a gate connected to a node between the seventh transistor M57 and the eighth transistor M58; an eleventh transistor M61 that has a drain connected to a drain of the tenth transistor M60 and a gate connected to a node between the seventh transistor M57 and the eighth transistor M58; a twelfth transistor M62 that has a drain connected to a source of the eleventh transistor M61, a gate to which the second reference signal DET2 is input, and a source connected to the ground; a second latch LT2 that has an input terminal connected to a node between the tenth transistor M60 and the eleventh transistor M61; and a sixth inverter IV56 that receives the output of the second latch LT2 and outputs the switching signal C2.

In the switching control unit 631, when the first reference signal DET1 is at a high level and the second control signal TCSR_EN is at a high level, the third, fourth, and sixth transistors M53, M54, and M56 are turned on, thus the third inverter IV53 outputs the switching signal C1 having a high level through the first latch LT1. When the first reference signal DET1 is at a high level and the second control signal TCSR_EN is at a low level, the signal DET1d becomes a high level. Accordingly, the third, fifth, and sixth transistors M53, M55, and M56 are turned on, thus the third inverter IV53 outputs the switching signal C1 having a low level through the first latch LT1. When the switching signal C1 is at the high level, the first reference signal DET1 causes the first control signal TCSR_ON to turn to a low level and the second control signal TCSR_EN to turn to a low level. As a result, the second reference signal DET2 is maintained at a low level, which blocks the output of the second switching signal C2. That is, the second reference signal generating unit 612 generates the signals DET1, DET1*d*, DET2, and DET2*d* only when the first control signal TCSR_ON is at a high level. The change of the first switching signal C1 to a high level means that the second periodic signal TC is generated by the second period generating unit 200 before the first reference signal DET1 is generated. Therefore, the first control signal TCSR_ON turns to a low level, and the signals DET2 and DET2*d* are maintained at a low level. Accordingly, no signal is input to the second latch LT2, which blocks the output of the second switching signal C2.

In the switching control unit 631, when the first reference signal DET1 is at a high level and the second control signal TCSR_EN is at a high level, the second periodic signal TC is generated by the second period generating unit 200 before the second reference signal DET2 is generated. Then, the ninth, tenth, and twelfth transistors M59, M60, and M62 are turned on, and thus a level of a node between the tenth transistor M60 and the eleventh transistor M61 becomes a high-level and the sixth inverter IV 56 outputs the second switching signal C2 having a high level through the second latch LT2.

Further, in the switching control unit 631, when the second reference signal DET2 is at a high level and the second control signal TCSR_EN is at a low level, the second periodic signal TC has not been generated at the time when the second reference signal DET2 is generated. When the second delayed reference signal DET2*d* changes to a high level, the ninth, eleventh, and twelfth transistors M59, M61, and M62 are turned on, and thus a level of a node between the tenth transistor M60 and the eleventh transistor M61 becomes a high-level and the sixth inverter IV 56 outputs the second switching signal C2 having a low level through the second latch LT2.

The switching unit 632 includes: a first inverter IV71 to which the first switching signal C1 is input; a first pass gate PG71 that has an input terminal to which the periodic signal NC_X1 is input, a first control terminal, that is, a P-type gate to which the output of the first inverter IV71 is input, and a second control terminal, that is an N-type gate to which the first switching signal C1 is input; a second inverter IV72 to which the second switching signal C2 is input; a second pass gate PG72 that has an input terminal to which the periodic signal NC_X2 is input, a P-type gate to which the output of the second inverter IV72 is input, an N-type gate to which the second switching signal C2 is input, and an output terminal connected to an output terminal of the first pass gate PG71; and a third pass gate PG73 that has an input terminal to which the periodic signal NC_X4 is input, a P-type gate to which the second switching signal C2 is input, an N-type gate to which the output of the second inverter IV72 is input, and an output terminal connected to the second pass gate PG72.

When the first control signal C1 is at a high level, the first pass gate PG71 is turned on, and thus the switching unit 632 outputs the periodic signal NC_X1. When the second control signal C2 is at a high level, the second pass gate PG72 is turned on, and thus the switching unit 632 outputs the periodic signal NC_X2. On the other hand, when the second control signal C2 is at a low level, the third pass gate PG73 is turned on, and thus the switching unit 632 outputs the periodic signal NC_X4.

Next, the operation of the apparatus for controlling the refresh operation of a semiconductor memory integrated circuit having the above-mentioned structure according to an embodiment of the invention will be described with reference to a timing chart shown in FIG. 7.

First, when a voltage is applied to a semiconductor memory integrated circuit to be operated, the first period generating unit 100 operates to output the periodic signal NC_X1, and the first frequency dividing unit 400 and the second frequency dividing unit 500 output the periodic signal NC_X2 having a period two times larger than that of the periodic signal NC_X1 and the periodic signal NC_X4 having a period four times larger than that of the periodic signal NC_X1, respectively. At that time, since a frequency is inverse proportion to the period, the periodic signal NC_X2 may be obtained by dividing the periodic signal NC_X1 by two. Also the periodic signal NC_X4 may be obtained by dividing the periodic signal NC_X1 by four or by dividing the periodic signal NC_X2 by two.

The period generation control unit 300 shown in FIG. 2 outputs the timing signal DET_ON for informing the timing of the determination of the temperature for every predetermined period (for example, 256 ms)

When the timing signal DET_ON is generated, the period selection control unit 600 outputs the first control signal TCSR_ON having a high level, which causes the second period generating unit 200 to start to operate.

When the second period generating unit 200 generates the second periodic signal TC in a first temperature determining period A of FIG. 7, it is determined that the temperature of the semiconductor memory integrated circuit is, for example, 90° C. or more, which is a high temperature.

The second control signal generating unit 622 shown in FIG. 5 generates the second control signal TCSR_EN having a high level by the second periodic signal TC. That is, the second control signal TCSR_EN changes from a low level to a high level, by the second periodic signal TC.

Then, since the second control signal TCSR_EN is at a high level at the time when the first reference signal DET1 is generated, the first control signal TCSR_ON output from the first control signal generating unit 621 of FIG. 5 turns to a low level, which causes the second control signal TCSR_EN output from the second control signal generating unit 622 to turn to a low level. Since the first control signal TCSR_ON turns to the low level, the operation of the second period generating unit 200 stops.

The switching control unit 631 of FIG. 6 outputs the first switching signal C1 having a high level at the time when the first reference signal DET1 changes to a high level and the second control signal TCSR_EN changes to a high level by the second periodic signal TC.

Since the first switching signal C1 is at the high level, the first pass gate PG71 in the switching unit 632 shown in FIG. 6 is turned on, and thus the periodic signal NC_X1 suitable for a high temperature condition is output as the refresh signal REFP.

Meanwhile, when the second period generating unit 200 generates the second periodic signal TC in a period B of FIG. 7, it is determined that the temperature of the semiconductor memory integrated circuit is about 45° C., which is room temperature.

The second control signal generating unit 622 generates the second control signal TCSR_EN having a high level by the second periodic signal TC.

Then, since the second control signal TCSR_EN is at a high level at the time when the second reference signal DET2 is generated, the first control signal TCSR_ON output from the first control signal generating unit 621 turns to a low level, which causes the second control signal TCSR_EN output from the second control signal generating unit 622 of FIG. 5 to turn to a low level. Since the first control signal TCSR_ON turns to the low level, the operation of the second period generating unit 200 stops.

The switching control unit 631 of FIG. 6 outputs the second switching signal C2 having a high level at the time when the second reference signal DET2 changes to a high level and the second control signal TCSR_EN changes to a high level by the second periodic signal TC. Since the second switching signal C2 is at the high level, the second pass gate PG72 is turned on in the switching unit 632 shown in FIG. 6, and thus the periodic signal NC_X2 suitable for a room temperature condition is output as the refresh signal REFP. At that time, when the first switching signal C1 is at a low level, the first pass gate PG71 is turned off, which blocks the output of the periodic signal NC_X1.

When the second periodic signal TC is generated neither in the period A nor the period B shown in FIG. 7, it is determined that the temperature of the semiconductor memory integrated circuit is lower than, for example, 45° C.

Since the first reference signal DET1 is at a high level and the second control signal TCSR_EN is a low level, the first switching signal C1 turns to a low level at the time when the first delayed reference signal DET1d changes to a high level after a predetermined time elapses, and thus the output of the periodic signal NC_X1 is blocked. Then, since the second reference signal DET2 turns to a high level and the second control signal TCSR_EN is at a low level, the second delayed reference signal DET2d changes to a high level after a predetermined time elapses, that is, a delay time corresponding to the pulse width of the second reference signal DET2, and thus sixth inverter IV56 of the switching control unit 631 shown in FIG. 6 outputs the second switching signal C2 having a low level through the second latch LT2. When the second delayed reference signal DET2d changes to a high level, the first control signal TCSR_ON output from the first control signal generating unit 621 shown in FIG. 5 turns to a low level, which causes the operation of the second period generating unit 200 to stop.

Since the second switching signal C2 is at a low level, the third pass gate PG73 of the switching unit 632 shown in FIG. 6 is turned on, and thus the periodic signal NC_X4 suitable for a low temperature condition is output as the refresh signal REFP. At that time, since the second switching signal C2 is at the low level, the output of the periodic signal NC_X2 is blocked.

Finally, when the second periodic signal TC is generated in the period A of FIG. 7, the operation of the second period generating unit 200 stops at the time when the first reference signal DET1 is generated, and the periodic signal NC_X1, which is a periodic signal suitable for a high temperature condition, is output as the refresh signal REFP. When the second periodic signal TC is generated in the period B, the operation of the second period generating unit 200 stops at the time when the second reference signal DET2 is generated, and the periodic signal NC_X2, which is a periodic signal suitable for a room temperature condition, is output as the refresh signal REFP. When the second periodic signal TC is not generated in both the periods A and B, it is determined that the second periodic signal TC is generated in a period C. Then, the operation of the second period generating unit 200 stops at the time when the second delayed reference signal DET2d is generated, and the periodic signal NC_X4, which is a periodic signal suitable for a low temperature condition, is output as the refresh signal REFP.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

According to the apparatus and method for controlling a refresh operation of a semiconductor memory of an embodiment of the invention, the period generating unit that outputs a periodic signal whose period varies according to temperature is operated in only the initial state of operation, that is, in only the temperature determining period, and is not operated in the other periods, which makes it possible to considerably reduce the overall current consumption.

What is claimed is:

1. An apparatus for controlling a refresh operation semiconductor memory integrated circuit, comprising:
   a first period generating unit configured to generate a first periodic signal having an uniform period and a frequency;
   a second period generating unit configured to generate a second periodic signal according to a first control signal;
   a period generation control unit configured to generate a timing signal for every predetermined period;
   a frequency dividing unit configured to divide the frequency of the first periodic signal, to generate at least one frequency-divided periodic signal; and
   a period selection control unit configured to stop an operation of the second period generating unit using the at least one frequency-divided periodic signal and the second periodic signal, determine temperature, and output the frequency-divided periodic signal corresponding to the determined temperature as a refresh signal.

2. The apparatus for controlling a refresh operation of a semiconductor memory integrated circuit of claim 1,
   wherein the first period generating unit is configured to generate the first periodic signal having a fixed period.

3. The apparatus for controlling a refresh operation of a semiconductor memory integrated circuit of claim 1,
   wherein the second period generating unit is configured to generate the second periodic signal having a period that varies according to temperature.

4. The apparatus for controlling a refresh operation of a semiconductor memory integrated circuit of claim 1,
   wherein the period generation control unit includes:
   a pulse generating unit configured to generate a basic pulse; and
   a plurality of counters configured to sequentially count the basic pulse output from the pulse generating unit to generate the timing signal.

5. The apparatus for controlling a refresh operation of a semiconductor memory integrated circuit of claim 1,
   wherein the period selection control unit includes:
   a reference signal generating unit configured to generate at least one reference signal using at least one frequency-divided periodic signal in response to the first control signal;
   a control signal generating unit configured to generate the first control signal and a second control signal on the basis of the timing signal and the reference signal; and
   a period selecting unit configured to select one of the first periodic signal and the frequency-divided periodic signal on the basis of the reference signal and the second control signal.

6. The apparatus for controlling a refresh operation of a semiconductor memory integrated circuit of claim 5, wherein the reference signal generating unit includes:
a first reference signal generating unit configured to configured to generate a first reference signal using a first one of the frequency-divided periodic signals, in response to the first control signal; and
a second reference signal generating unit configured to generate a second reference signal using a second one of the frequency-divided periodic signals, in response to the first control signal.

7. The apparatus for controlling a refresh operation of a semiconductor memory integrated circuit of claim 6,
wherein the first reference signal generating unit generates the first reference signal at a time when one period of the first frequency-divided periodic signal elapses.

8. The apparatus for controlling a refresh operation of a semiconductor memory integrated circuit of claim 6,
wherein the first reference signal generating unit includes:
a series of inverters configured to receive the first frequency-divided periodic signal to produce an output;
a NOR gate configured to receive the first frequency-divided periodic signal and the output of the series of inverters as input and to produce an output based thereon;
a NAND gate configured to receive the output of the NOR gate and the first control signal as input and to produce an output based thereon; and
an inverter configured to receive the output of the NAND gate and output the first reference signal.

9. The apparatus for controlling a refresh operation of a semiconductor memory integrated circuit of claim 8, further comprising:
a delay configured to delay the output of the inverter to output a first delayed reference signal.

10. The apparatus for controlling a refresh operation of a semiconductor memory integrated circuit of claim 6,
wherein the second reference signal generating unit generates the second reference signal at a time when one period of the second frequency-divided periodic signal elapses.

11. The apparatus for controlling a refresh operation of a semiconductor memory integrated circuit of claim 6,
wherein the second reference signal generating unit includes:
a series of inverters configured to receive the second frequency-divided periodic signal as input and to produce an output;
a NOR gate configured to receive the second frequency-divided periodic signal and the output of the series of inverters as input and to produce an output based thereon;
a NAND gate configured to receive the output of the NOR gate and the first control signal as input and to produce an output based thereon; and
an inverter configured to receive the output of the NAND gate and outputs the second reference signal.

12. The apparatus for controlling a refresh operation of a semiconductor memory integrated circuit of claim 11, further comprising:
a delay configured to delay the output of the inverter to output a second delayed reference signal.

13. The apparatus for controlling a refresh operation of a semiconductor memory integrated circuit of claim 5,
wherein the control signal generating unit includes:
a first control signal generating unit configured to generate the first control signal according to the timing signal and the reference signal; and a second control signal generating unit configured to generate the second control signal according to the first control signal and the second periodic signal.

14. The apparatus for controlling a refresh operation of a semiconductor memory integrated circuit of claim 13,
wherein the first control signal generating unit includes:
a first NAND gate configured to receive a first reference signal and the second control signal as input and to produce an output based thereon;
a second NAND gate configured to receive a second reference signal and the second control signal as input and to produce an output based thereon;
a first pulse generator configured to receive the output of the first NAND gate as input and to produce an output based thereon;
a second pulse generator configured to receive the output of the second NAND gate as input and to produce an output based thereon;
a first NOR gate configured to receive the outputs of the first and second pulse generators as input and to produce an output based thereon;
a first inverter configured to receive the output of the first NOR gate as input and to produce an output based thereon;
a first transistor that has a drain, a gate configured to receive the output of the first inverter and a source which is connected to the ground;
a second inverter configured to receive a power-up signal as input and to produce an output;
a second NOR gate configured to receive the output of the second inverter and the timing signal as input and to produce an output an output based thereon;
a second transistor that has a gate configured to receive the output of the second NOR gate, a source which is connected to a power supply terminal, and a drain which is connected to the drain of the first transistor;
a latch that has an input terminal connected to the drain of the second transistor and an output; and
a third inverter configured to receive the output of the latch and output the first control signal.

15. The apparatus for controlling a refresh operation of a semiconductor memory of integrated circuit claim 14,
wherein the first control signal generating unit further comprises:
a third transistor that has a gate configured to receive a second delayed reference signal, a source which is connected to the ground, and a drain which is connected to both the drain of the first transistor and the drain of the second transistor.

16. The apparatus for controlling a refresh operation of a semiconductor memory integrated circuit of claim 13,
wherein the second control signal generating unit includes:
a first inverter configured to receive the second periodic signal as input and to produce an output;
a first transistor that has a drain, a source which is connected to a power supply terminal and a gate configured to receive the output of the first inverter;
a second inverter configured to receive the first control signal as input and to produce an output;
a second transistor that has a source which is connected to the ground, a gate configured to receive the output of the second inverter is input, and a drain which is connected to a drain of the first transistor;
a latch that has an output terminal and an input terminal connected to the drains of the first transistor and the second transistor; and a third inverter that is connected to the output terminal of the latch and configured to output the second control signal.

17. The apparatus for controlling a refresh operation of a semiconductor memory integrated circuit of claim 5,
wherein the period selecting unit includes:
a switching control unit configured to output a first and second switching signals according to the reference signal and the second control signal; and
a switching unit configured to output one of the first periodic signal and the frequency-divided periodic signal according to the switching signal.

18. The apparatus for controlling a refresh operation of a semiconductor memory integrated circuit of claim 17,
wherein the switching control unit includes:
a first switching control unit configured to output a first switching signal according to a first one of the reference signals and the second control signal; and
a second switching control unit configured to output a second switching signal according to a second one of the reference signals and the second control signal.

19. The apparatus for controlling a refresh operation of a semiconductor memory integrated circuit of claim 17,
wherein, when a first reference signal and the second control signal are enabled, the first switching control unit enables the first switching signal.

20. The apparatus for controlling a refresh operation of a semiconductor memory integrated circuit of claim 17,
wherein the first switching control unit includes:
a first inverter configured to receive a first delayed reference signal as input and to produce an output based thereon;
a first transistor that has a drain, a source connected to a power supply terminal and a gate configured to receive the output of the first inverter;
a second transistor that has a source connected to the ground, a gate configured to receive the second control signal, and a drain connected to the drain of the first transistor;
a second inverter configured to receive a first reference signal as input and to produce an output;
a third transistor that has a drain, a source connected to the power supply terminal and a gate configured to receive the output of the second inverter;
a fourth transistor that has a drain, a source connected to the drain of the third transistor and a gate connected to a drains of the first transistor and the second transistor;
a fifth transistor that has a source, a drain connected to the drain of the fourth transistor and a gate connected to the drains of the first transistor and the second transistor;
a sixth transistor that has a drain connected to the source of the fifth transistor, a gate configured to receive the first reference signal, and a source connected to the ground;
a latch that has an output and an input terminal connected to the drains of the fourth transistor and the fifth transistor; and
a third inverter configured to receive the output of the latch and output the first switching signal.

21. The apparatus for controlling a refresh operation of a semiconductor memory integrated circuit of claim 18,
wherein, when a second reference signal and the second control signal are enabled, the second switching control unit enables the second switching signal.

22. The apparatus for controlling a refresh operation of a semiconductor memory integrated circuit of claim 18,
wherein the second switching control unit includes:

a first inverter configured to receive a second delayed reference signal as input and to produce an output;
a first transistor that has a drain, a source connected to a power supply terminal and a gate configured to receive the output of the first inverter;
a second transistor that has a source connected to the ground, a gate configured to receive the second control signal, and a drain connected to the drain of the first transistor;
a second inverter configured to receive a second reference signal as input and to produce an output;
a third transistor that has a drain, a source connected to the power supply terminal and a gate configured to receive the output of the second inverter;
a fourth transistor that has a drain, a source connected to a drain of the third transistor and a gate connected to the drains of the first transistor and the second transistor;
a fifth transistor that has a source, a drain connected to the drain of the fourth transistor and a gate connected to the drains of the first transistor and the second transistor;
a sixth transistor that has a drain connected to the source of the fifth transistor, a gate configured to receive a first reference signal, and a source connected to the ground;
a latch that has an output and an input terminal connected to the drains of the fourth transistor and the fifth transistor; and
a third inverter configured to receive the output of the latch and output the second switching signal.

23. The apparatus for controlling a refresh operation of a semiconductor memory integrated circuit of claim 17,
wherein the switching unit includes:
a first switching element configured to pass the first periodic signal according to the first switching signal;
a second switching element configured to pass a first one of the frequency-divided periodic signals according to the second switching signal; and
a third switching element configured to pass a second one of the frequency-divided periodic signals according to the second switching signal.

24. The apparatus for controlling a refresh operation of a semiconductor memory integrated circuit of claim 23,
wherein the first to third switching elements are pass gates.

25. The apparatus for controlling a refresh operation of a semiconductor memory integrated circuit of claim 23,
wherein the first frequency-divided periodic signal is a signal obtained by dividing the frequency of the first periodic signal by two, and
the second frequency-divided periodic signal is a signal obtained by dividing the frequency of the first frequency-divided periodic signal by two.

26. A method of controlling a refresh operation of a semiconductor memory integrated circuit including a first period generating unit that generates a first periodic signal having a fixed period, a frequency dividing unit that divides the frequency of the first periodic signal into at least one frequency-divided periodic signal and outputs the frequency-divided periodic signals, and a second period generating unit that generates a second periodic signal whose period varies according to temperature, comprising:
starting the second period generating unit;
comparing a time when the second period generating unit generates the second periodic signal to the first periodic signal and the at least one frequency-divided periodic signal to determine the temperature;
stopping the second period generating unit according to the timing of the determination of the temperature; and selecting one of the frequency-divided periodic signal and the first periodic signal corresponding to the determined temperature to output the selected signal as a refresh signal.

27. The method of controlling a refresh operation of a semiconductor memory integrated circuit of claim 26, wherein the starting of the second period generating unit is repeatedly performed for every predetermined period.

28. The method of controlling a refresh operation of a semiconductor memory integrated circuit of claim 26, wherein the determining of the temperature comprises determining the temperature in one period in which the second periodic signal is generated among two or more periods that are temporally divided starting when the first period generating unit operates.

29. The method of controlling a refresh operation of a semiconductor memory integrated circuit of claim 26, wherein the stopping the second period generating unit includes stopping the second period generating unit at an end point of one period in which the second periodic signal is generated among two or more periods that are temporally divided starting when the first period generating unit operates.

30. The method of controlling a refresh operation of a semiconductor memory integrated circuit of claim 26, wherein the stopping the second period generating unit includes stopping the second period generating unit regardless of the generation of the second periodic signal at an end point of the last period among two or more periods that are temporally divided starting when the first period generating unit operates.

31. The method of controlling a refresh operation of a semiconductor memory integrated circuit of claim 26, wherein the selecting of the signal corresponding to the determined temperature as the refresh signal includes:
selecting one of the first periodic signal and the at least one frequency-divided signal that has a higher frequency as the determined temperature value is higher and outputting the selected signal as the refresh signal; and
selecting one of the first periodic signal and the at least on frequency-divided signals that has a lower frequency as the determined temperature value is lower and outputting the selected signal as the refresh signal.

32. An apparatus for controlling a refresh operation of a semiconductor memory integrated circuit, comprising:
a first period generating unit configured to generate a first periodic signal having an uniform period and a frequency;
a second period generating unit configured to generate a second periodic signal according to a control signal having temperature information;
a period generation control unit configured to generate a timing signal for every predetermined period;
a plurality of frequency dividing units configured to divide the frequency of the first periodic signal, to generate a plurality of frequency-divided periodic signal; and
a period selection control unit configured to receive the first periodic signal, the timing signal and the frequency-divided periodic signal thereby generating the control signal, control the second period generating unit using the control signal, determine temperature, and output the frequency-divided periodic signal corresponding to the determined temperature as a refresh signal.

* * * * *